United States Patent [19]

Alivisatos et al.

[11] Patent Number: 5,262,357
[45] Date of Patent: Nov. 16, 1993

[54] LOW TEMPERATURE THIN FILMS FORMED FROM NANOCRYSTAL PRECURSORS

[75] Inventors: A. Paul Alivisatos, Berkeley; Avery N. Goldstein, Oakland, both of Calif.

[73] Assignee: The Regents of the University of California, Oakland, Calif.

[21] Appl. No.: 796,242

[22] Filed: Nov. 22, 1991

[51] Int. Cl.$^5$ ............... H01L 21/00; H01L 21/02; H01L 21/469
[52] U.S. Cl. ................... 437/233; 437/225; 437/228; 437/234
[58] Field of Search ............... 437/225, 228, 233, 234

[56] References Cited

PUBLICATIONS

Steigerwald, Surface Derivatization and Isolation of Semiconductor Cluster Molecules, J. Am. Chem. Soc. 1988, 110, pp. 3046-3050.
Buffat et al., Phys. Rev. A (1976) 13(6):2287-2298.
Hahn et al., Phys. Rev. Lett. (1988) 61(10):1190-1193.
Sheng et al., J. Phys. (1981) C 14:L565-L569.
Berry et al., Phys. Rev. A (1984) 30(2):919-931.
Honeycutt et al., J. Phys. Chem. (1987) 91:4950-4963.
Olshavsky et al., J. Amer. Chem. Soc. (1990) 112:9438-9439.

Primary Examiner—Brian E. Hearn
Assistant Examiner—B. Everhart
Attorney, Agent, or Firm—Morrison & Foerster

[57] ABSTRACT

Nanocrystals of semiconductor compounds are produced. When they are applied as a contiguous layer onto a substrate and heated they fuse into a continuous layer at temperatures as much as 250, 500, 750 or even 1000° K below their bulk melting point. This allows continuous semiconductor films in the 0.25 to 25 nm thickness range to be formed with minimal thermal exposure.

7 Claims, 4 Drawing Sheets

LOW TEMPERATURE THIN FILMS FORMED FROM NANOCRYSTAL PRECURSORS

REFERENCE TO GOVERNMENT SUPPORT

This invention was made with Government support under Contract No. DE-AC0376SF00098 between the United States Department of Energy and the University of California for the operation of Lawrence Berkeley Laboratory. The Government has certain rights in this invention.

FIELD OF THE INVENTION

This invention relates to thin films of inorganic semiconductor materials and their formation under relatively low temperature conditions.

BACKGROUND OF THE INVENTION

The reduction of the melting point in nanometer size metal and molecular crystals is well established experimentally (Ph. Buffat and J.-P. Borel *Phys. Rev. A* (1976) 13:2287; M. Y. Hahn and R. L. Whetten, *Phys. Rev. Lett.* (1988) 61:1190, and is the subject of numerous theoretical studies and simulations (P. Sheng, R. W. Cohen, and J. R. Schrieffer, *J. Phys.* (1981) C 14:L565; R. S. Berry, J. Jellinek, and G. Natanson *Phys. Rev. A* (1984) 30:919; J. D. Honeycutt and H. C. Andersen, *J. Phys. Chem.* (1987) 91:4950). It is of interest to extend these studies of melting to other classes of materials. In particular, systems in which the bonding is more covalent and the structure more open may behave differently. Also, studies of covalent systems would extend current models of melting which rely on the concept of surface tension, a term difficult to define for a covalent cluster. Finally, the study of melting in any cluster material lends insight into the stability of these metastable systems, an issue vital to the development of new synthetic methods Despite the many reasons to study melting in clusters, the field has been until recently limited to metals and molecular crystals. New developments in chemical methods of preparation have enabled the synthesis of narrow size distributions of highly crystalline, nanometer size, crystallites of inorganic semiconductors like CdS and GaAs (M. L. Steigerwld et al., *J. Am. Chem. Soc.* (1988) 110:3046; M. A. Olshavsky, A. N. Goldstein, and A. P. Alivisatos, "Organometallic Synthesis of GaAs Crystallites Exhibiting Quantum Confinement," *J. Am. Chem. Soc.*, in press). These materials are polar semiconductors and have open structures. They are large enough to possess the bulk zincblende crystal structure, but a large fraction of the atoms are on the surface. Hence, as in the metal clusters, it is expected that the surface will play a dominant role in their high temperature behavior.

We have recognized that a useful application of this effect could be in the formation of thin-film of conductors and semiconductors in chip fabrication and the like in that the lower temperatures make it possible to form thin film with less thermal hazard to thermally sensitive underlayers, substrates and other structures.

SUMMARY OF THE INVENTION

We have now demonstrated that nanocrystals of semiconducting inorganic materials melt at temperatures as much as 500, 750 or even 1000° K below the bulk melting temperature of the same material. This finding is embodied in this invention as a process for forming thin layers of semiconducting inorganic materials. In accord with this process, a thin contiguous layer of nanocrystals of semiconducting material is deposited on the surface Then the nanocrystals are heated to a temperature which is not greater than 250° K below the bulk melting point of the semiconducting material. This temperature causes the nanocrystals to fuse into a continuous thin film which upon cooling solidifies.

In another aspect, this invention provides thin semiconductor films formed by fusing nanocrystals of semiconductor materials at temperatures substantially below their bulk melting points.

DETAILED DESCRIPTION OF THE INVENTION

Brief Description of the Drawings

This invention will be further described with reference to the accompanying drawings in which.

DESCRIPTION OF PREFERRED EMBODIMENTS

The Semiconductors

Figure 1:
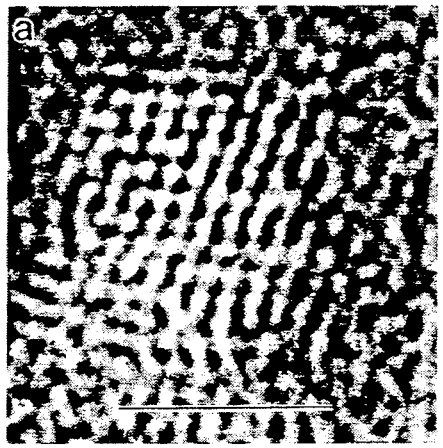
FIG. 1 is a transmission electron micrograph of a CdS nanocrystal before heating.
Figure 2:
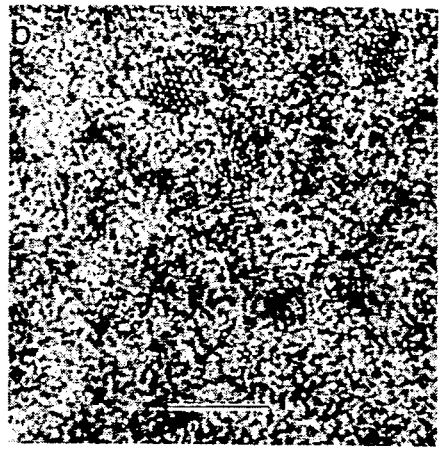
FIG. 2 is a wider view transmission electron micrograph showing that there are many 30 Å Cds particles present.
Figure 4:
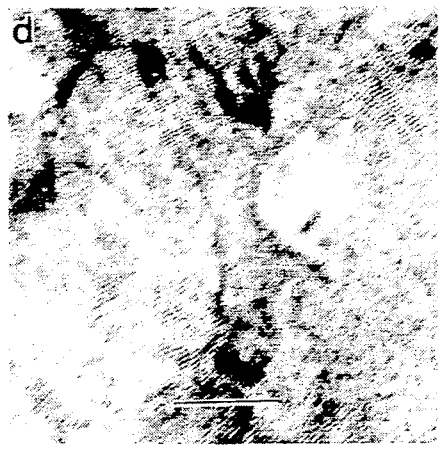
FIG. 4 is a transmission electron micrograph of the material of FIG. 1 after heating.
Figure 5:
FIG. 5 shows the material of FIG. 2 after heating.
Figure 3:
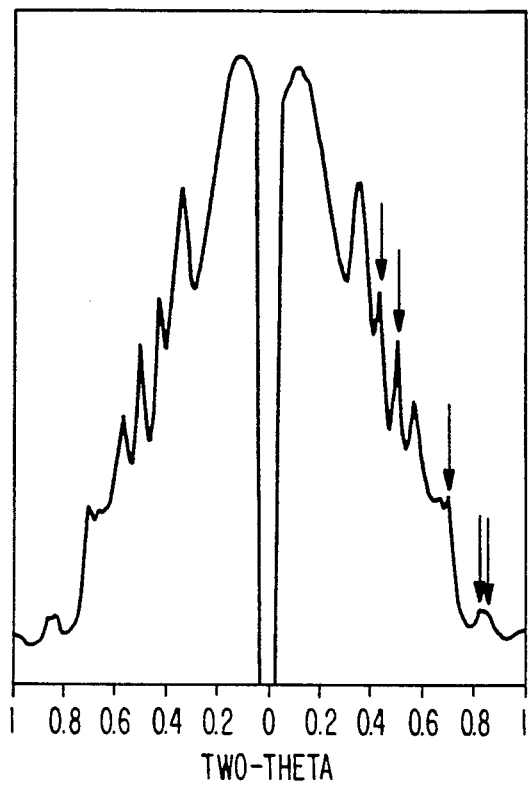
FIG. 3 is the electron diffraction pattern exhibited by a 30 Å CdS nanocrystal before heating.
Figure 6:
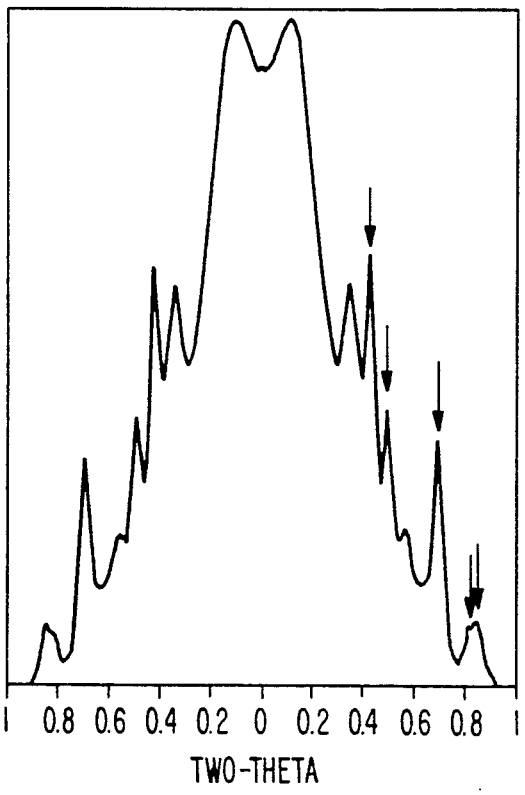
FIG. 6 is the electron diffraction pattern exhibited by a 30 Å CdS nanocrystal after heating.

This invention provides a method for forming films of semiconducting compounds. It finds application with III-V semiconducting compounds such as GaAs, GaP, GaAs-P, GaSb, InAs, InP, InSb, AlAs, AlP, and AlSb; and with II-VI semiconducting compounds such as CdS, CdSe, CdTe, HgS, ZnS, ZnSe and ZnTe. These compounds and their applications in solid state electronic devices are well known.

The Nanocrystals

The present invention employs the above-described semiconducting compounds in nanocrystals. A nanocrystal is defined to be a crystallite having dimensions in the nanometer range, that is, of less than 100 Å (10 nm).

While materials through this size range will work, as a general rule, materials having dimensions in the 1 to 6 nm range are preferred, and especially 1 to 5 nm.

These materials in their nanocrystalline form can be formed by various precipitation techniques designed to prevent macrocrystal formation.

In a copending United States patent application filed on even date with this application by P. Alivisatos and M. Olshavsky and incorporated by reference, together with their earlier publication (with A. N. Goldstein)

appearing at *J.A.C.S.* (1990) 112:9438 (December, 1990), a process for forming nanocrystals of III-V compounds such as GaAs is set forth.

In this process, a group III metal source, such as a GaIII salt, InIII salt, or AlIII salt or corresponding metal 1-6 carbon trialkyls, is reacted directly with an arsenic, phosphorus, or antimony source such as arsine, phosphine, or stibine, an alkyl arsine, phosphine or stibine, or an alkyl silyl arsine phosphine or stibine in liquid phase at an elevated temperature Representative metal sources include $GaCl_3$, $GaBr_3$, $GaI_3$, $InCl_3$, $InBr_3$, $AlCl_3$, $Ga(Me)_3$, $Ga(Et)_3$, $Ga(Bu)_3$, or the like. Representative arsenic, phosphorus and selinium sources include $AsH_3$, $PH_3$, $SeH_3$, $AsH_2$(1-6 carbon alkyl), As(-1-4 carbon alkyl)3, P(1-4 carbon alkyl)$_3$, $As(Si(1-6$ carbon alkyl)$_3$)$_3$, $P(Si(1-6$ carbon alkyl)3)3, $Se(Si(1-4$ carbon alkyl)$_3$)$_3$ and the like.

One of each of these two groups of materials are mixed together in a nonaqueous liquid reaction medium which includes a crystal growth terminator and heated to a temperature of at least about 100° C. for a prolonged period of at least about 1 hour. Polar organics, such as nitrogen- and phosphorus-containing organics, can serve as crystal growth terminators. Water and air should be excluded from the reaction zone. This causes the desired nanocrystals to form. The reaction medium can then be removed to yield the nanocrystals in dry form.

II-VI materials such as CdS can be formed as nanocrystals using colloidal precipitation techniques. In one technique, a group II metal source such as a CdII salt, an HgII salt or a ZnII salt is dissolved in water and this solution suspended in an organic liquid such as hexane, heptane or octane or the like with a colloid former such as deoctylsulfosuccinate. A suitable group VI counterion (sulfide, selenide or telluride) source is dissolved in water and similarly suspended in an organic liquid. These two suspensions are mixed to yield a colloidal suspension of nanocrystals of the semiconductor compound. This suspension is destabilized by addition of a capping group, for example a thioacid such as thiophenol or mercaptoacetic acid. This causes the nanocrystals to precipitate for recovery.

Typical metal sources include cadmium II sources, for example salts and dialkyls, such as $CdCl_2$, $Br_2$ or $I_2$, $Cd(ClO_4)_2$, Cd(1-6 carbon alkyl)$_2$, as well as mercury II and zinc II equivalents. Counterions can be provided by simple salts such as alkali metal sulfides, selenides or tellurides, $Na_2S$, $K_2S$, $Na_2Se$, $K_2Se$, $Na_2Te$ and $K_2Te$. This general method for forming nanocrystals is referred to as a "reverse micelle" method and is described in more detail in M. L. Steigerwald et al., *J. Am. Chem. Soc.* 110:3046 (1988), which is incorporated herein by reference.

Other colloidal precipitation methods will work as well. For example, one can precipitate the II-VI materials out of acidic or basic media in the presence of capping agents such as mercaptoacetate ions, in the form of colloidal nanocrystals.

These methods are representative, and other methods which provide nanocrystals of these materials can be used as well.

The Film-Forming Process

In accord with this invention, thin films of semiconducting compounds are formed by a. depositing a contiguous layer of nanocrystals of the semiconducting compound on a substrate and b. fusing the nanocrystals at a temperature below the bulk melting point of the semiconducting compound.

A "contiguous" layer of nanocrystals is one in which enough particles are present to form a layer of particles touching one another. If the particles are not touching, they will not flow together when fused.

Thicker layers, such as up to 3 or 4 particles deep can be employed However, vastly thicker layers such as 20 or 30 particles deep begin to act as if they are bulk materials and do not properly fuse at the low temperatures employed.

The fusing together of the nanocrystals takes place at a temperature at least 250° K, preferably 500° K, more preferably 750° K, and in some settings as much as 1000 or 1100° K below the bulk melting temperature of the semiconductor compound. Typically, this heating is carried out under vacuum and is completed within 15 seconds to 30 minutes, and especially 1 to 20 minutes. The products of this process are continuous thin films of semiconducting materials corresponding in stoichiometry to the nanocrystals from which they are formed. These films are from about 0.25 to about 20 nm in thickness.

These thin films can be formed on any suitable surface or substrate, for example on carbon, on silicon, on selenium oxide, on other oxides such as alumina, boria or titania; on metals such as gold, copper, silver or aluminum or the like; on high-temperature thermally stable polymers such as aramids, carbonates, esters and the like. This last family of possible substrates is important as the process of the invention with its low operating temperatures allows for such deposit of semiconductors which could not be achieved with processes of the past.

The products of this invention have semiconducting properties and can be used in semiconductor applications.

This invention will be described by the following examples which are presented to illustrate the invention but not to limit its scope which is defined by the appended claims.

EXAMPLE 1

30 Å diameter CdS nanocrystals were prepared using the reverse micelle method of M. L. Steigenwald, et al., *J. Am. Chem. Soc.* (1988) 110:3046. Two separate solutions of 500 ml spectrographic grade heptane and 44.4 g of dioctylsulfosuccinate (A.O.T.) were prepared under nitrogen 2.34 g of $CdClO_4.6H_2O$ dissolved in 12 ml deoxygenated deionized water were added to one solution while 0.36 g $Na_2S.9H_2O$ dissolved in 12 ml deoxygenated deionized water were added to the other. Both solutions were clear and colorless after one hr of mixing. The cadmium solution was transferred to the well-stirred sulfide solution via a 16 gauge double transfer needle over 15 min, resulting in the formation of a clear yellow solution of CdS nanocrystals. 500 ml of the resulting solution was "capped" with 0.45 mg of thiophenol, which resulted in precipitation of the nanocrystals. The powder was filtered and rinsed repeatedly with petroleum ether. The powder was redissolved in 10 ml pyridine, filtered, reprecipitated by addition to 200 ml petroleum ether, filtered and rinsed again. The powder was redissolved in quinoline, and refluxed under inert atmosphere at 237° C. for 3 hr. Finally, the nanocrystals were reprecipitated and filtered one more time. The resulting powder was dissolved in pyridine and deposited by evaporation as a contiguous layer on an amorphous carbon substrate evaporated onto a 300 mesh Ni grid for the electron diffraction studies. This material is checked for nanocrystal size and used in a transmission electron microscopy (TEM) study of melting temperature (Tm). The CdS nanocrystals ranged in size from 24 Å to 36 Å as determined by X-ray powder diffraction, TEM and UV-VIS spectrometry. Tm is defined as the disappearance of diffraction intensity and linewidths associated with the solid in selected area diffraction (SAD) patterns. The particles were also characterized by X-ray powder diffraction to provide more precise d-spacing values than obtained in TEM. It was determined that the CdS nanocrystals melt and recrystallize at size dependent temperatures dramatically lower than the bulk Tm. The variation in size for a given sample is ±3% in diameter, as determined by X-ray powder diffraction (XRD), TEM, and UV-VIS spectrometry.

The melting experiments were conducted in such a way as to minimize beam spurious beam heating. Experiments used a 0.2 $\mu m^2$ field of particles dispersed on a thin amorphous carbon film in a JEOL 200 analytical microscope operating at 200 kV with condenser and objective lens currents controlled to ±0.002 amps. Electron flux is limited to about 800 e-/$A^2$ sec in the sample plane, well below fluxes commonly required to affect beam induced transformations. Under these conditions beam heating of the sample cannot account for more than 0.25° K increase in particle temperature, within the kinematic scattering approximation.

Camera constants were calibrated with room temperature diffraction patterns of samples with XRD determined d-spacings. The specimens were resistively heated in 25° K steps using a tantalum furnace hot stage. A thermocouple monitored the temperature of the furnace and was calibrated by examining the reversible phase transition of a-quartz ←→ b-quartz, which occurs at 1173° K and was observed repeatedly in our hot stage within 2° K of this temperature.

The experimental procedure consisted of heating to at least one third Tm and incrementally cooling before the melting cycle to further anneal the particles. The sample was then heated to 50° K beyond Tm and cooled stepwise. Concurrent bright and dark field observations of the particles were made. The ring diffraction patterns were digitized with a 2048 channel linear array CCD and radially integrated through the pattern center over a 5° arc. High resolution TEM images were obtained before and after melting studies to assess changes in lattice structure and particle morphology using a JEOL 200CX with 2 Å spatial resolution at 200 kV.

The results of a heating cycle are shown in FIGS. 1-6. The atomic resolution image of a single thiophenol-capped particle before heating shows differences in atomic spots, which are produced by columns of atoms parallel to the beam axis suggesting vacancies within columns of low intensity. A variation in the <111> d-spacing is also noted with an accompanying bending of the atomic planes being visible. When these particles are dispersed at sufficiently low densities such that there is no contact between particles melting and recrystallization occurs as demonstrated by the SAD patterns before (FIG. 3) and after (FIG. 6) melting from different fields on the same grid. The linewidth and therefore the domain size as obtained from the Scherrer formula is maintained. At high particle densities (i.e., where they are contiguous) the molten particles fuse to produce a thin polycrystalline film. The CdS crystallized from the melt appears to show a preferential orientation on the amorphous carbon substrate with <111> planes lying parallel to the substrate. Energy dispersive spectroscopy on particle fields before and after melting shows that the stoichiometry of the sample is maintained when the loss of thiols is accounted for.

Figure 7:
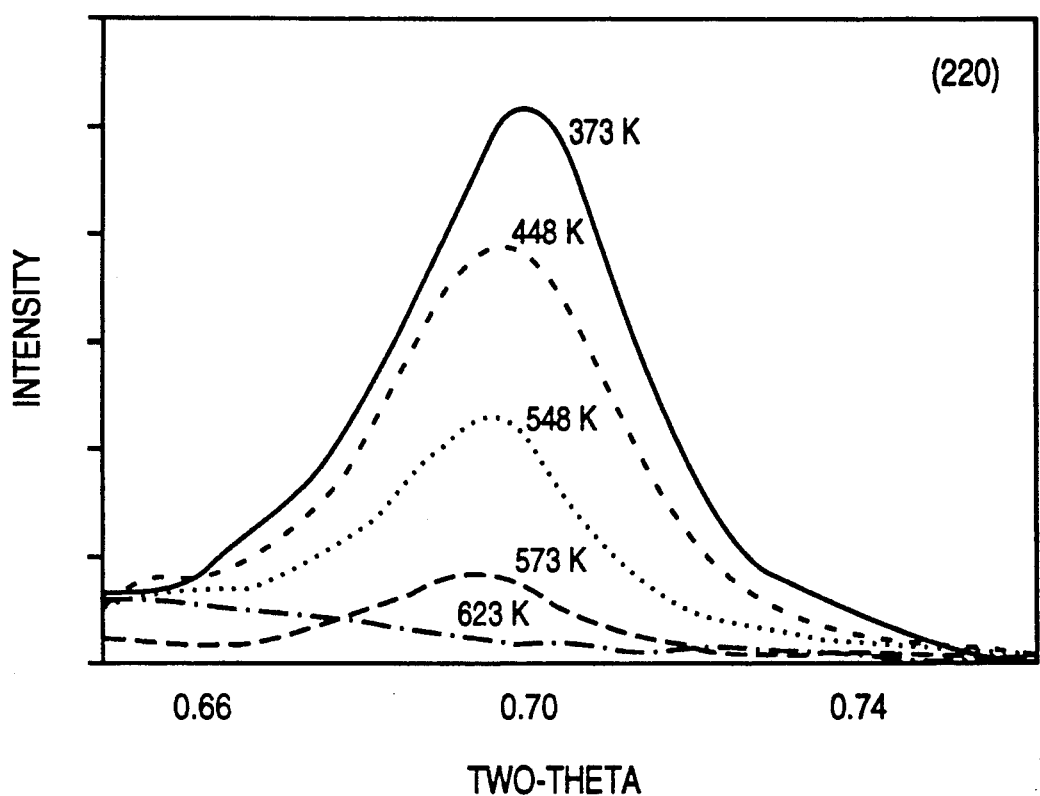
FIG. 7 is a graph which illustrates the drop in intensity of the 220 peak observed in the electron diffraction pattern of a 30 Å CdS crystal when the crystal is heated to various temperatures.
Figure 8:
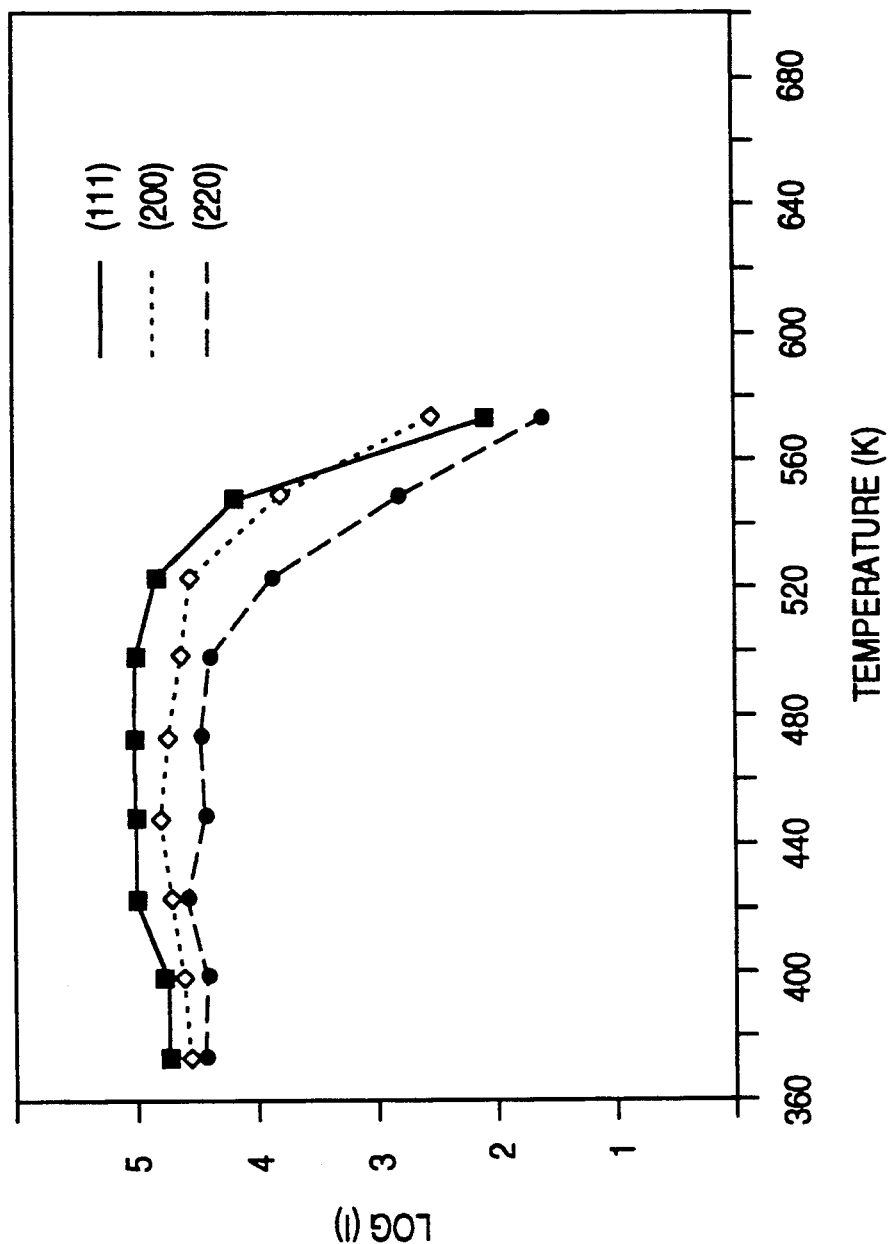
FIG. 8 is a graph showing the drop-off of electron diffraction peak intensity of the 111, 200 and 220 peaks for a CdS nanocrystal heated to various temperatures.
Figure 9:
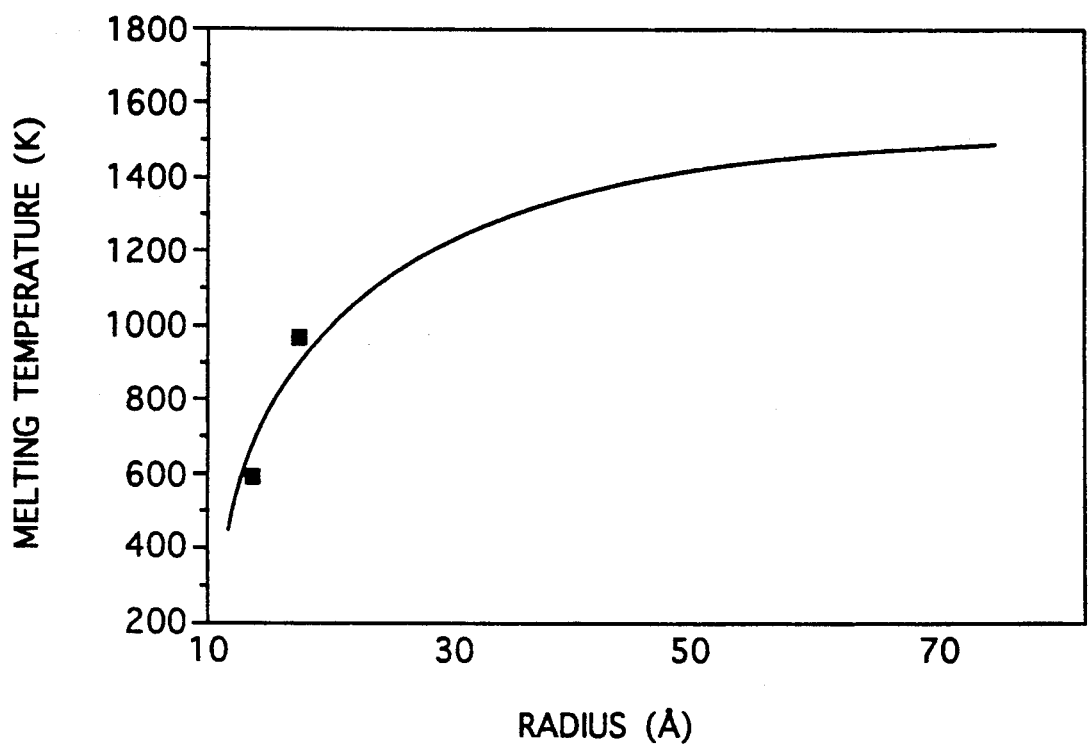
FIG. 9 is a graph showing the relationship between the radius of a nanocrystal and its melting temperature.

FIGS. 7 and 8 show the changes in diffraction peak intensity as a function of temperature. The intensity drops rapidly with temperature and has completely disappeared into the amorphous carbon background at 623° K. This compares to a bulk Tm of 1678° K. The linewidths do not change appreciably and are consistent with real space observations which suggest that the melting is not gradual, but rather a sudden collapse of the lattice. FIG. 9 shows the melting temperature as a function of particle diameter. The temperature goes up with particle size.

Tm for a given size does not appear to depend on the nature of the surface moiety. Preliminary temperature programmed DEI mass spectrometry experiments demonstrated that the surface sites of the thiophenol and mercaptoacetic acid terminated particles are depopulated at 523° and 463° K, respectively. Additionally, the majority of the organics are volatilized in the course of the annealing cycle preceding melting. As in the case of bare metallic nanocrystals the energy contribution of atoms being in strained bonding sites on the surface and the modifications to minimize surface area dictate the size dependent behavior of the crystallites.

In conclusion, this example shows that colloidal CdS nanocrystals melt at temperatures proportional to 1/radius. Isolated particles retain a spherical shape and original size, adjoining particles sinter to form polycrystalline thin films.

EXAMPLE 2

Preparation of Cadmium Sulfide Nanocrystal Clusters from an Acidic Colloid

A 500 ml solution of $1 \times 10^{-3}$M $CdCl_2$ was prepared, and to this was added a 500 ml solution of $1.6 \times 10^{-3}$M sodium mercaptoacetate, resulting in a turbid blue solution. The pH was lowered to 3.35 with HCl, producing a colorless solution. 150 ml of $1 \times 10^{-2}$M $Na_2S$ was then injected to the quickly stirring solution. This preparation gave nanocrystals with an absorption maximum at 460 nm. Crystallites with absorption maxima as low as 360 nm could be obtained by reducing concentrations.

When these nanocrystals are heated as in Example 1, they behave similarly giving a fused thin layer at a temperature significantly below the bulk melting temperature.

EXAMPLE 3

Preparation of Cadmium Sulfide Nanocrystal Clusters from a Basic Colloid

One liter of $1 \times 10^{-3}$M $CdCl_2$ was titrated with mercaptoacetic acid to pH 2.8, resulting in a turbid blue solution, as above. Concentrated NaOH was then added dropwise until the pH was greater than 8.5 and the solution was again colorless. While the solution was quickly stirred, 110 ml of $1 \times 10^{-2}$M $Na_2S$ was added. Nanocrystal particle sizes with absorption maxima between 360 nm and 410 nm were produced by varying the final pH of the thiol titration.

The colloids from Examples 2 and 3 were reduced by rotary evaporation to a redissolvable powder which contained NaCl as a reaction byproduct. Dialysis against a dilute solution of mercaptoacetic acid was used to remove the salt while maintaining the solubility of the colloids. Solutions of redissolved crystallites were stable in the dark for months. All reactions were conducted in room light using deionized, distilled water. The colloids can be grown by heating to 90° C. in the presence of 0.5 ml of the thiol.

When these nanocrystals are heated as in Example 1, they behave similarly, giving a fused thin layer at a temperature significantly below the bulk melting temperature.

EXAMPLE 4

The preparations of Examples 1-3 are repeated varying the starting materials. In place of $CD(ClO_4)_2 \cdot 6H_2O$ and $CdCl_2$, $ZnCl_2$ can be used leading to ZnS nanocrystals.

When these nanocrystals are heated as in Example 1, they behave similarly giving a fused thin layer at a temperature significantly below the bulk melting temperature.

EXAMPLE 5

The preparations of Examples 1-3 are repeated varying the starting materials. In place of $Na_2S$, $Na_2Se$ is used leading to CdSe nanocrystals.

When these nanocrystals are heated as in Example 1, they behave similarly giving a fused thin layer at a temperature significantly below the bulk melting temperature.

EXAMPLE 6

$GaCl_3$ (99.99%) was purchased from Aldrich, purified by sublimation, and stored in a dry box. Tris(trimethylsilyl)arsine was prepared according to literature methods, Becker, G. et al., *Anorg. Allg. Chem.* (1980) 462:113, purified by vacuum distillation, and stored in a dry box at 0° C. Proton NMR and infrared spectra matched the literature values.

Tris(trimethylsilyl)arsine: IR (neat liquid) 2892 (m), 2890 (s), 2828 (s), 2816 (s), 2785 (vs), 1446 (s), 1400 (Vs), 1306 (s), 1259 (Vs), 1240 (W), 1124 (m), 869 (W), $^1H$ NMR (300 MHz, $C_6D_6$) δ0.35 (s, $SiMe_3$). Quinoline was purchased from Aldrich and distilled immediately prior to use Quinoline (25 mL) containing $6.5 \times 10^{-3}$ mol of tris(trimethylsilyl)arsine was added to $6.5 \times 10^{-3}$ mol of $GaCl_3$ in 25 mL of quinoline. The resulting mixture was heated at reflux (240° C.) for 3 days. A red powder was isolated by removal of the solvent, and the powder consisted of GaAs particles which are redissolvable in pyridine or quinoline.

The quinoline-soluble GaAs particles were studied by TEM. TEM revealed prolate GaAs particles with an average major axis of 45 Å and minor axes of 35 Å.

When these nanocrystals are heated as in Example 1, they behave similarly giving a fused thin layer at a temperature significantly below the bulk melting temperature.

EXAMPLE 7

The preparation of Example 6 is repeated using a corresponding phosphine, tris(trimethylsilyl)phosphine, in place of the arsine of Example 6. This leads to GaP nanocrystals as the product.

When these nanocrystals are heated as in Example 1, they behave similarly giving a fused thin layer at a temperature significantly below the bulk melting temperature.

EXAMPLE 8

The preparation of Example 6 is repeated using $InCl_3$ as a starting material in place of $GaCl_3$. This leads to InAs nanocrystals as the product.

When these nanocrystals are heated as in Example 1, they behave similarly giving a fused thin layer at a temperature significantly below the bulk melting temperature.

What is claimed is:

1. A process for forming a solid continuous thin film of a semiconductor material on a solid support surface comprising the steps of
   (a) depositing on the solid support surface a thin contiguous layer of nanocrystals of the semiconductor material,
   (b) exposing the nanocrystals to a temperature which is not greater than 250° K below the bulk melting point of the semiconductor material, which temperature nonetheless is adequate to melt the nanocrystals and cause them to fuse into a continuous thin film, and
   (c) cooling the continuous thin film to yield a solid continuous thin film.

2. The process of claim 1 wherein the nanocrystals have an average diameter of from 1 to about 6 nm.

3. The process of claim 2 wherein the semiconductor is a II-VI material.

4. The process of claim 2 wherein the semiconductor is a III-V material.

5. The process of claim 2 wherein the temperature is not greater than 500° K below the bulk melting point of the semiconductor material.

6. The process of claim 2 wherein the semiconductor is GaAs.

7. The process of claim 2 wherein the semiconductor is CdS.

* * * * *